(12) United States Patent
Marsh

(10) Patent No.: US 9,355,837 B2
(45) Date of Patent: May 31, 2016

(54) METHODS OF FORMING AND USING MATERIALS CONTAINING SILICON AND NITROGEN

(71) Applicant: Micron Technology, Inc., Boise, ID (US)

(72) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/497,080

(22) Filed: Sep. 25, 2014

(65) Prior Publication Data

US 2016/0093484 A1   Mar. 31, 2016

(51) Int. Cl.
*H01L 21/02* (2006.01)
*H01L 45/00* (2006.01)

(52) U.S. Cl.
CPC ........ *H01L 21/0217* (2013.01); *H01L 21/0228* (2013.01); *H01L 21/02208* (2013.01); *H01L 45/06* (2013.01); *H01L 45/143* (2013.01); *H01L 45/144* (2013.01); *H01L 45/1608* (2013.01)

(58) Field of Classification Search
CPC ... H01L 45/1233; H01L 45/06; H01L 45/144; H01L 2924/00; H01L 45/143
See application file for complete search history.

(56) References Cited

U.S. PATENT DOCUMENTS

| | | | |
|---|---|---|---|
| 6,586,056 B2 | 7/2003 | Arkles et al. | |
| 2005/0025885 A1* | 2/2005 | McSwiney et al. | 427/248.1 |
| 2005/0227017 A1* | 10/2005 | Senzaki et al. | 427/459 |
| 2012/0104347 A1* | 5/2012 | Quick | 257/4 |

* cited by examiner

*Primary Examiner* — Tony Tran
(74) *Attorney, Agent, or Firm* — Wells St. John P.S.

(57) ABSTRACT

Some embodiments include methods utilizing atomic layer deposition to form material containing silicon and nitrogen (e.g., silicon nitride). The atomic layer deposition uses $SiI_4$ as one precursor and uses a nitrogen-containing material as another precursor. Some embodiments include methods of forming a structure in which a chalcogenide region is formed over a semiconductor substrate; and in which $SiI_4$ is used as a precursor during formation of silicon nitride material directly against a surface of the chalcogenide region.

16 Claims, 2 Drawing Sheets

METHODS OF FORMING AND USING MATERIALS CONTAINING SILICON AND NITROGEN

TECHNICAL FIELD

Methods of forming and using materials containing silicon and nitrogen.

BACKGROUND

Silicon nitride is commonly utilized during fabrication of integrated circuitry. For instance, silicon nitride may be utilized as an insulating material during fabrication of transistors, memory cells, logic devices, memory arrays, etc.

Difficulties may be encountered when utilizing conventional methods for deposition of silicon nitride. For instance, conventional methods may utilize temperatures which are too high for some applications. Also, conventional methods may lead to erosion (for instance, corrosion) of materials underlying the silicon nitride. For example, it can be difficult to deposit silicon nitride on chalcogenide materials utilizing conventional methods due to corrosion of the underlying chalcogenide.

It would be desirable to develop new methods of silicon nitride deposition which address the above-described difficulties associated with conventional methods.

DETAILED DESCRIPTION OF THE ILLUSTRATED EMBODIMENTS

In some aspects, the invention includes new methods of silicon nitride formation (e.g., deposition) which utilize atomic layer deposition (ALD). The ALD uses $SiI_4$ as one precursor, and uses a nitrogen-containing material as another precursor. The nitrogen-containing material may be organic (for instance, t-butyl hydrazine), or inorganic (for instance, $NH_3$). In some embodiments, a mixture of nitrogen-containing materials may be utilized as precursor for the ALD, and in other embodiments only one nitrogen-containing material may be utilized as precursor for the ALD (for instance, only $NH_3$, or only t-butyl hydrazine). In the claims that follow, the term "a nitrogen-containing material" may be utilized to refer to a precursor material which is pure (for instance, which is entirely $NH_3$ or entirely t-butyl hydrazine), or may refer to a precursor which contains "a nitrogen-containing material" as part of a mixture of nitrogen-containing materials.

In some embodiments, ALD may be used to form material comprising silicon and nitrogen. Such material may comprise, consist essentially of, or consist of silicon nitride; and/or may have other compositions.

An example ALD sequence is described with reference to FIG. 1, with such sequence utilizing processing steps that may be referred to in some embodiments as "pulses". The sequence may be conducted utilizing any suitable reaction chamber. The sequence comprises a pulse 2 of first precursor, followed by a pulse 3 of purge gas, a pulse 4 of second precursor, and a pulse 5 of purge gas. The ALD sequence of FIG. 1 may be considered to utilize first and second precursors which are introduced into the reaction chamber at different and non-overlapping times relative to one another. Although the pulses of the FIG. 1 sequence are all shown to have approximately equal durations as one another, in other embodiments one or more of the pulses may have a different duration relative to one or more of the other pulses.

The pulses 2-5 form a single iteration of the ALD sequence, and such iteration may be repeated multiple times to form a material to a desired thickness. The formed material comprises silicon and nitrogen; and may, for example, comprise, consist essentially of, or consist of silicon nitride.

Figure 1:
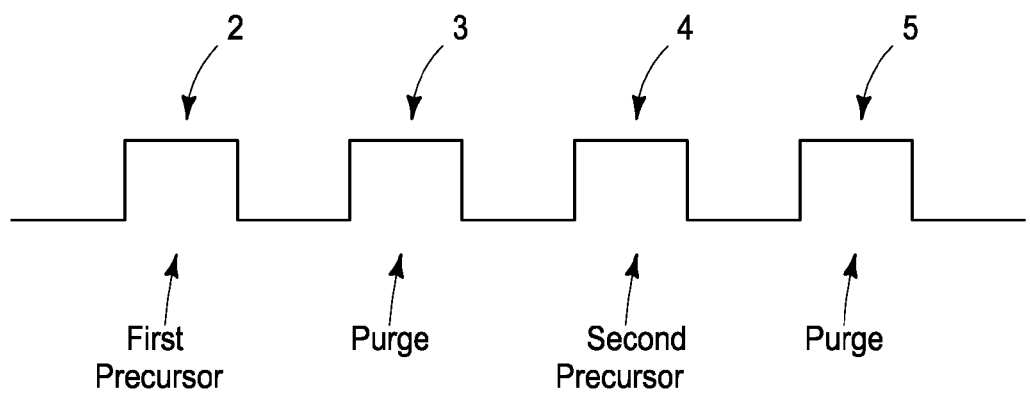
FIG. 1 is a diagrammatic pulse diagram of an example embodiment pulse sequence.

One of the first and second precursors of the deposition sequence of FIG. 1 comprises $SiI_4$ and the other comprises nitrogen-containing material. In applications in which multiple iterations are utilized to form a layer of material, the nitrogen-containing material (i.e., nitrogen-containing precursor) may be the same in all of the iterations, or may vary in some iterations relative to others. For instance, in some example embodiment deposition sequences, $NH_3$ may be used in all iterations; in some example embodiment deposition sequences, t-butyl hydrazine may be used in all iterations; and in some example embodiment deposition sequences, $NH_3$ may be used in some iterations while t-butyl hydrazine is used in other iterations. The material formed with the deposition sequence of FIG. 1 may be relatively pure silicon nitride (i.e., may consist of silicon nitride or consist essentially of silicon nitride) in some embodiments; or may comprise silicon and nitrogen in combination with other elements (i.e., may comprise silicon and nitrogen with other elements, or may comprise silicon nitride with other elements) in other embodiments.

The purge gas may comprise any suitable carrier, including, for example, one or more of helium, argon and nitrogen. Such carrier may also be utilized to flow the first and second precursors into the reaction chamber. The $SiI_4$ is preferably protected from exposure to light during utilization in the deposition sequence of FIG. 1.

Any suitable pressure may be utilized during the deposition sequence; including, for example, pressures within a range of from about 0.1 Torr to about 1 Torr; such as, for example, pressures in the neighborhood of about 0.5 Torr.

An example deposition sequence will grow about 0.13 Å of silicon nitride per iteration.

The formation sequence of FIG. 1 may be conducted at any suitable temperature. For instance, in some example embodiments the formation sequence is conducted while a temperature within the reaction chamber is maintained at less than or equal to about 250° C., and in some example embodiments the formation sequence is conducted while a temperature within the reaction chamber is maintained at less than or equal to about 175° C. The temperature may remain the same during the first and second pulses in some embodiments, or may be varied from one pulse to another in other embodiments.

The utilization of low temperatures may advantageously reduce a thermal budget of an overall formation (e.g., deposition) sequence as compared to conventional methods of forming silicon nitride, which may alleviate, or even eliminate, problems discussed above in the "Background" section. For instance, low-temperature ALD processing may alleviate or prevent problems associated with corrosion and/or other degradation of chalcogenide and/or other materials directly adjacent the deposited silicon nitride. The low-temperature ALD processing may also alleviate or prevent degradation of materials already formed prior to the ALD processing (such as, for example, materials associated with an integrated circuit) as compared to conventional methods of forming silicon nitride at higher temperatures.

Figure 2:
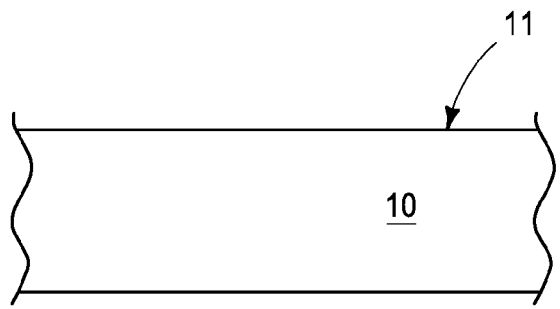
FIGS. 2 and 3 are diagrammatic cross-sectional side views of a construction at process stages of an example embodiment method.
Figure 3:
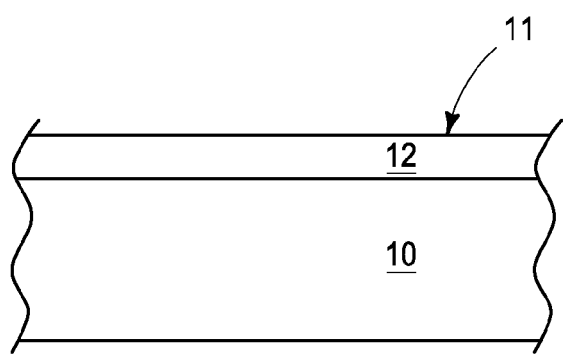
Figure 5:
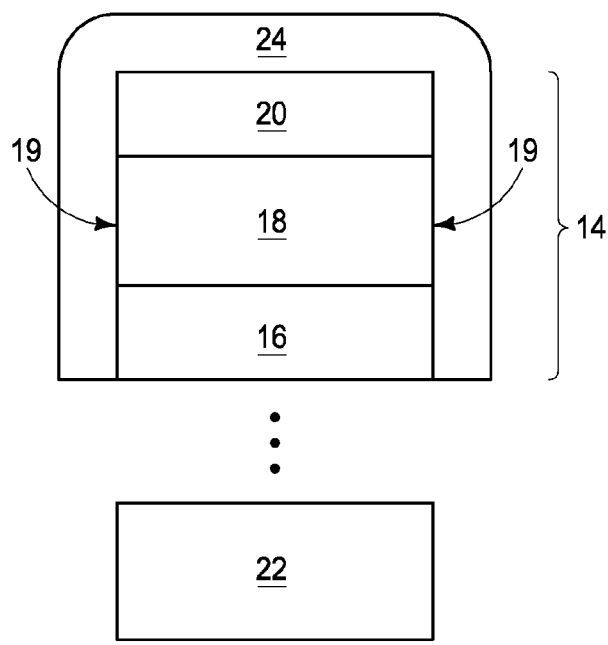

An example deposition is described with reference to FIGS. 2 and 3. A base material 10 is shown in FIG. 2, with such material having an upper surface 11. FIG. 3 shows a processing stage following that of FIG. 2, and specifically shows silicon nitride material 12 formed directly against the upper surface 11; with the silicon nitride material comprising, consisting essentially of, or consisting of silicon nitride. The silicon nitride material may be deposited utilizing the ALD deposition sequence described above with reference to FIG. 1, and may be formed to any suitable thickness utilizing multiple iterations of such deposition sequence. Although the silicon nitride material is shown being formed along a horizontal upper surface, it may also be formed on vertical surfaces or any other exposed surfaces (for instance, FIG. 5 shows silicon nitride material being formed on vertical sidewall surfaces).

The base material 10 may comprise any of numerous compositions, including, for example, insulative materials (for instance, silicon dioxide, hafnium oxide, aluminum oxide, etc.), conductive materials (for instance, metal, conductively-doped silicon, conductively-doped germanium, metal silicide, metal carbide, etc.), and/or semiconductor materials (for instance, silicon, germanium, etc.). In some embodiments, base material 10 may comprise chalcogenide and the silicon nitride material 12 may be deposited directly against a surface of such chalcogenide. Example chalcogenides may comprise one or more of arsenic, germanium, indium, selenium, antimony, tellurium, sulfur, copper, etc.; with some specific examples including arsenic, selenium and indium; germanium, antimony and tellurium; indium, antimony and tellurium; and/or one or more $Ge_2Sb_2Te_5$, $GeS_2$, $GeSe_2$, $CuS_2$, CuTe, etc. In some embodiments, the silicon nitride material 12 may protect base material 10 from contamination and/or reaction during subsequent processing.

Another example deposition is described with reference to FIGS. 4 and 5.

Figure 4:
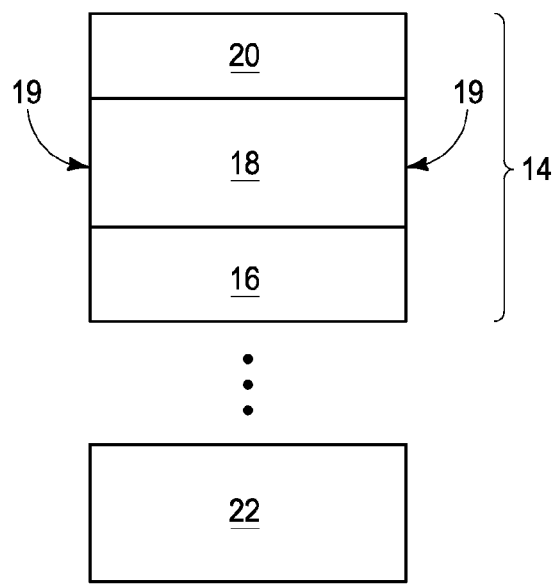
FIGS. 4 and 5 are diagrammatic cross-sectional side views of a construction at process stages of another example embodiment method.

Referring to FIG. 4, an assembly 14 is shown to be supported by a substrate 22. A gap is provided between assembly 14 and substrate 22 to diagrammatically illustrate that multiple materials and/or levels may be between the assembly 14 and the substrate 22.

In some embodiments, substrate 22 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, substrate 22 may correspond to a semiconductor substrate containing one or more materials associated with integrated circuit fabrication. Some of the materials may correspond to, for example, one or more of refractory metal materials, barrier materials, diffusion materials, insulator materials, etc. In some embodiments, substrate 22 may comprise, consist essentially of, or consist of monocrystalline silicon.

The assembly 14 comprises a chalcogenide region 18 between a pair of conductive electrodes 16 and 20. In some embodiments, the assembly 14 may correspond to a phase change memory (PCM) cell. The assembly 14 is an example assembly that may utilize a chalcogenide region. Other assemblies may be utilized in other embodiments.

The chalcogenide region 18 may comprise any suitable composition or combination of compositions; and in some embodiments may comprise one or more of the chalcogenides described above with reference to FIG. 2.

The conductive electrodes 16 and 20 may comprise any suitable compositions or combinations of compositions; and in some embodiments may comprise, consist essentially of, or consist of carbon and/or carbon-containing compositions; one or more of various metals (for example, tungsten, titanium, etc.); metal-containing compositions (for instance, metal nitride, metal carbide, metal silicide, etc.); and conductively-doped semiconductor materials (for instance, conductively-doped silicon, conductively-doped germanium, etc.). The conductive electrodes 16 and 20 may be the same composition as one another in some embodiments, and may comprise different compositions relative to one another in other embodiments.

The chalcogenide region 18 has exposed sidewall surfaces 19.

Referring to FIG. 5, silicon nitride material 24 is formed directly against sidewall surfaces 19. The silicon nitride material may be formed utilizing the deposition sequence described above with reference to FIG. 1; and accordingly may be formed utilizing ALD with $SI_4$ as a precursor and with nitrogen-containing material as another precursor.

The silicon nitride material 24 may protect surfaces 19 from oxidation during subsequent processing. Utilization of the deposition sequence of FIG. 1 may enable the silicon nitride material to be formed without exposing structures of assembly 14, or other structures associated with substrate 22, to undesired temperatures associated with the thermal processing of conventional silicon nitride deposition. Also, utilization of the deposition sequence of FIG. 1 may alleviate corrosion and/or other undesired damage of the sidewalls 19 of chalcogenide region 18 as compared to conventional methods.

The assembly 14 may be representative of one of many memory cells of a PCM array fabricated utilizing the processing of FIGS. 4 and 5. In other embodiments, chalcogenide regions may be utilized in other memory structures, and/or other integrated circuit structures. Regardless, deposition of silicon nitride material directly against one or more surfaces of the chalcogenide region utilizing processing described above with reference to FIG. 1 may alleviate difficulties associated with conventional silicon nitride deposition methodologies.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, methods of forming material comprise utilization of atomic layer deposition with $SiI_4$ as one precursor and a nitrogen-containing material as another precursor.

In some embodiments, a method of forming a structure comprises forming a chalcogenide region over a semiconductor substrate; and comprises using $SiI_4$ as a precursor during formation of material directly against a surface of the chalcogenide region. The material comprises silicon and nitrogen.

In some embodiments, a method of forming a structure comprises forming an assembly comprising a chalcogenide region adjacent a conductive region, with the chalcogenide region comprising at least one sidewall. The method also comprises utilizing $SiI_4$ as a precursor during formation of silicon nitride material directly against the sidewall of the chalcogenide region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a structure, comprising:
    forming a chalcogenide region over a semiconductor substrate; and
    utilizing $SiI_4$ as a precursor during formation of material directly against a surface of the chalcogenide region, where the material comprises silicon and nitrogen and the formation of the material utilizing $SiI_4$ is conducted at temperature of less than or equal to about 250° C.

2. The method of claim 1 wherein the material consists essentially of silicon nitride.

3. The method of claim 1 wherein the material consists of silicon nitride.

4. The method of claim 1 wherein the chalcogenide region comprises at least one of indium, germanium, antimony and tellurium.

5. The method of claim 1 wherein the chalcogenide region comprises at least one of arsenic, selenium and indium.

6. The method of claim 1 wherein the formation of the material is conducted at temperature of less than or equal to about 175° C.

7. The method of claim 1 wherein the formation of the material comprises atomic layer deposition.

8. The method of claim 1 wherein $NH_3$ is utilized as another precursor during the formation of the material.

9. The method of claim 1 wherein t-butyl hydrazine is utilized as another precursor during the formation of the material.

10. A method of forming a structure, comprising:
    forming an assembly comprising a chalcogenide region adjacent a conductive region, the chalcogenide region comprising at least one sidewall; and
    utilizing $SiI_4$ as a precursor during formation of silicon nitride material directly against the sidewall of the chalcogenide region, the formation of the material utilizing $SiI_4$ being conducted at temperature of less than or equal to about 250° C.

11. The method of claim 10 wherein the chalcogenide region comprises at least one of arsenic, selenium and indium.

12. The method of claim 10 wherein the chalcogenide region comprises at least one of germanium, indium, antimony and tellurium.

13. The method of claim 10 wherein the formation of the silicon nitride material is conducted at temperature of less than or equal to about 175° C.

14. The method of claim 10 wherein the formation of the silicon nitride material comprises atomic layer deposition.

15. The method of claim 10 wherein $NH_3$ and/or t-butyl hydrazine is utilized as another precursor during the formation of the silicon nitride material.

16. The method of claim 10 wherein the structure comprises a phase change memory cell.

* * * * *